United States Patent
Naito et al.

(10) Patent No.: US 8,994,342 B2
(45) Date of Patent: Mar. 31, 2015

(54) SWITCHING APPARATUS

(75) Inventors: Takayuki Naito, Toyota (JP); Takashi Imai, Okazaki (JP); Koichi Mizutani, Toyota (JP); Kouichi Yamanoue, Hiroshima (JP); Shigeki Yamamoto, Hiroshima (JP)

(73) Assignees: Toyota Jidosha Kabushiki Kaisha, Toyota (JP); Visteon Global Technologies, Inc., Van Buren Township, MI (US)

(*) Notice: Subject to any disclaimer, the term of this patent is extended or adjusted under 35 U.S.C. 154(b) by 558 days.

(21) Appl. No.: 13/381,531

(22) PCT Filed: Jul. 1, 2010

(86) PCT No.: PCT/JP2010/061568
§ 371 (c)(1),
(2), (4) Date: Dec. 29, 2011

(87) PCT Pub. No.: WO2011/007707
PCT Pub. Date: Jan. 20, 2011

(65) Prior Publication Data
US 2012/0105042 A1    May 3, 2012

(30) Foreign Application Priority Data
Jul. 17, 2009  (JP) ................. 2009-169383

(51) Int. Cl.
*H03K 17/041*    (2006.01)
*H02M 3/155*    (2006.01)
*H02M 7/00*    (2006.01)

(52) U.S. Cl.
CPC ............. *H03K 17/041* (2013.01); *H02M 3/155* (2013.01); *H02M 7/003* (2013.01); *H03K 2217/0036* (2013.01)
USPC ......................................................... 323/223

(58) Field of Classification Search
CPC ..... H02M 3/155; H02M 3/156; H02M 3/158; H03K 7/08; H03K 17/56
USPC ................. 323/271, 282, 351, 335, 222, 223; 363/147; 361/152, 156, 204, 748, 760, 361/763, 783; 307/115, 109, 98
See application file for complete search history.

(56) References Cited

U.S. PATENT DOCUMENTS 4,670,833 A * 6/1987 Sachs ............................ 363/132
5,844,786 A * 12/1998 Yoshida et al. ............. 363/21.01
(Continued)

FOREIGN PATENT DOCUMENTS

| JP | 08-140343 | 5/1996 |
| JP | 09-042096 | 2/1997 |
| JP | 2005-110452 | 4/2005 |

OTHER PUBLICATIONS

International Search Report in International Application No. PCT/JP2010/061568; dated Sep. 6, 2010.
(Continued)

*Primary Examiner* — Gary L Laxton
*Assistant Examiner* — Kyle J Moody
(74) *Attorney, Agent, or Firm* — Oliff PLC

(57) ABSTRACT

A switching apparatus is disclosed that includes a first loop circuit configured to include a switching element, an inductive component and a capacitor; and a second loop circuit configured to share the inductive component with the first loop circuit, wherein the capacitor is inserted in series with the inductive component in the first loop, wherein the switching apparatus controls respective currents flowing through the first loop circuit and the second loop circuit in an alternating manner by turning on/off the switching element in order to control the current flowing through the inductive component, and wherein a first magnetic flux generated by the current flowing through the first loop circuit as the switching element is being turned on and a second magnetic flux generated by the current flowing through the second loop circuit as the switching element is being turned off head in the same direction.

10 Claims, 13 Drawing Sheets

(56) References Cited

U.S. PATENT DOCUMENTS

| | | | | |
|---|---|---|---|---|
| 6,300,679 | B1* | 10/2001 | Mukerji et al. | 257/738 |
| 6,373,736 | B2* | 4/2002 | Matsumoto et al. | 363/147 |
| 7,342,805 | B2* | 3/2008 | Larson | 361/780 |
| 2005/0057445 | A1* | 3/2005 | Bezal et al. | 345/60 |
| 2009/0056121 | A1* | 3/2009 | Sasaki et al. | 29/854 |
| 2011/0148370 | A1* | 6/2011 | Mizutani et al. | 323/271 |
| 2011/0273014 | A1* | 11/2011 | Naito et al. | 307/43 |
| 2012/0119723 | A1* | 5/2012 | Mizutani et al. | 323/311 |

OTHER PUBLICATIONS

Written Opinion of the International Searching Authority in International Application No. PCT/JP2010/061568; dated Sep. 6, 2010.
International Preliminary Report on Patentability in International Application No. PCT/JP2010/061568; dated Sep. 14, 2011.
May 8, 2012 Japanese Office Action issued in Japanese Patent Application No. 2009-169383 (with translation).

* cited by examiner

Prior Art

Prior Art

US 8,994,342 B2

SWITCHING APPARATUS

TECHNICAL FIELD

The present invention relates to a switching apparatus which includes a first loop circuit and a second loop circuit that share an inductive component, and controls current flowing through the inductive component.

BACKGROUND ART

Conventionally, a control apparatus for an electric motor has been known which reduces high-frequency noise such as radio noise by disposing a capacitor, used for absorbing the high-frequency noise, between a gate of a switching element used for PWM control of the electric motor and an upstream side-terminal of the electric motor (see, e.g., Patent Document 1). Patent Document 1: Japanese Laid-Open Patent Application No. H09-42096

Since the control apparatus for the electric motor reduces the noise by adding the capacitor or the like which is connected to the gate of the switching element, the number of elements used for reducing the noise is increased, and the composition of the control apparatus for the electric motor becomes complex.

DISCLOSURE OF INVENTION

It is a general object of the present invention to provide a switching apparatus which reduces high-frequency noise by improving the circuit configuration of the switching apparatus.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by a switching apparatus particularly pointed out in the specification in such full, clear, concise, and exact terms as to enable a person having ordinary skill in the art to practice the invention.

To achieve these and other advantages and in accordance with the purpose of the invention, as embodied and broadly described herein, an embodiment of the present invention provides a switching apparatus including a first loop circuit configured to include a switching element, an inductive component and a capacitor; and a second loop circuit configured to share the inductive component with the first loop circuit, wherein the capacitor is inserted in series with the inductive component in the first loop, wherein the switching apparatus controls respective currents flowing through the first loop circuit and the second loop circuit in an alternating manner by turning on/off the switching element in order to control the current flowing through the inductive component, and wherein a first magnetic flux generated by the current flowing through the first loop circuit as the switching element is being turned on and a second magnetic flux generated by the current flowing through the second loop circuit as the switching element is being turned off head in the same direction.

Other objects and further features of the present invention will be apparent from the following detailed description when read in conjunction with the accompanying drawings.

BEST MODE FOR CARRYING OUT THE INVENTION

In the following, preferred embodiments of the present invention are described with reference to the drawings. An exemplary embodiment of the switching apparatus of the present invention includes a load drive apparatus for driving an inductive load including an inductive component.

Figure 1:
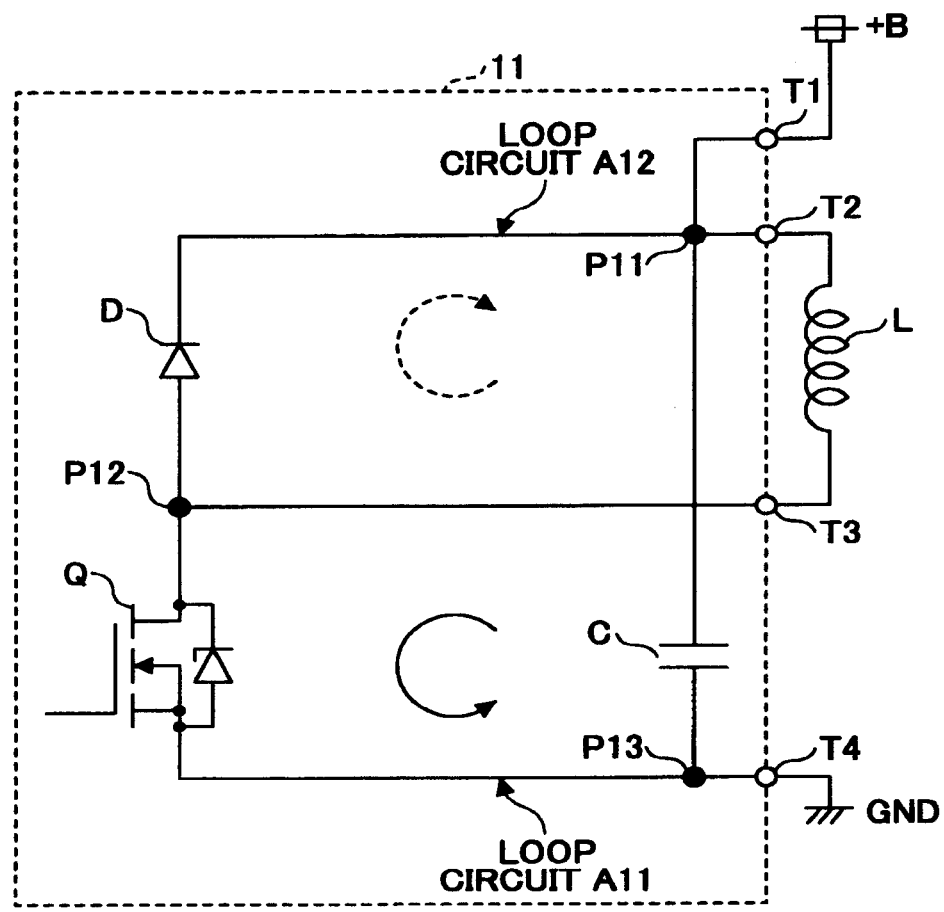
FIG. 1 shows a circuit configuration of a conventional load drive apparatus.

FIG. 1 shows a circuit configuration of a conventional load drive apparatus. A load drive circuit 11 drives an inductive load including an inductive component L by switching on and off a switching element Q. The load drive circuit 11 includes a loop circuit A11 and a loop circuit A12 which share the inductive component L between the loop circuit A11 and the loop circuit A12. As the switching element Q is being turned on, current is flowing through the loop circuit A, i.e. through the inductive load including the inductive component L and the switching element Q in order. As the switching element Q is being turned off, current is flowing through the loop circuit B, i.e. through the inductive load including the inductive component L and a diode D in order.

Figure 2:
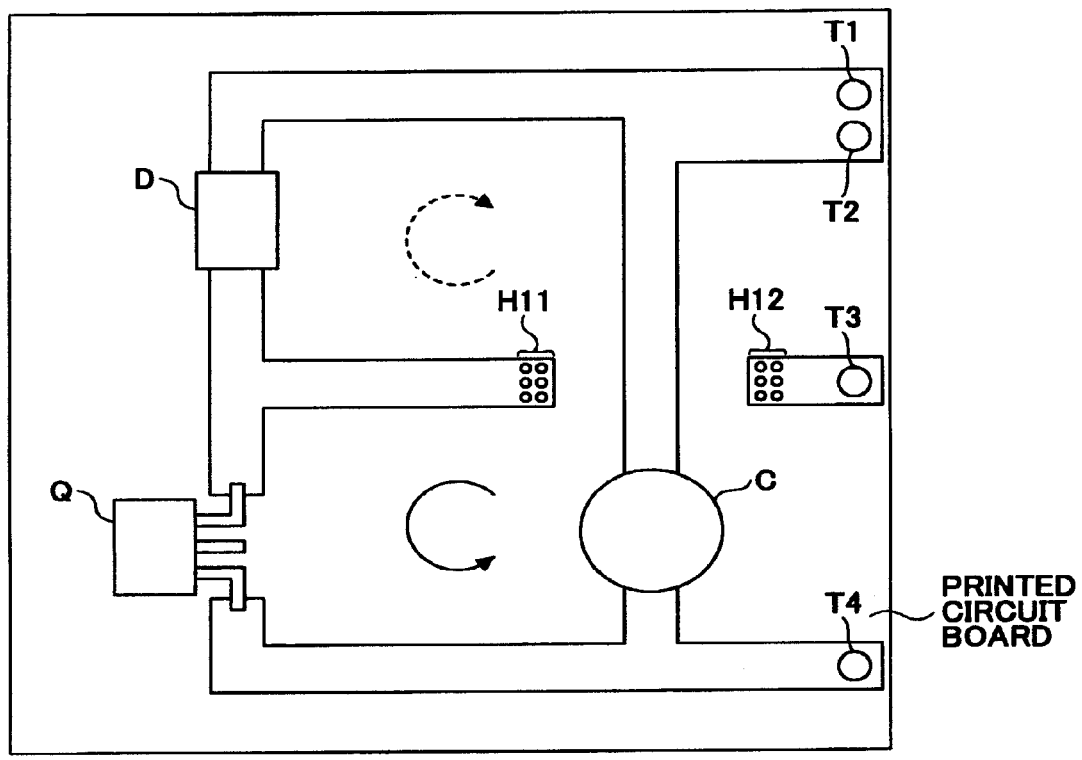
FIG. 2 shows an arrangement of components included in the conventional load drive apparatus.

In general, the circuit shown in FIG. 1 is realized by disposing elements and patterned lines, which are necessary for realizing the circuit, onto a printed circuit board. In FIG. 2, a patterned line which is maintained at the same potential as the potential of a connecting point P12 (shown in FIG. 1) that connects the diode D and the switching element Q, and a patterned line which is maintained at the same potential as the potential of a terminal T3 that is connected to one end of the inductive load including the inductive component L via a wiring harness, are connected with each other on the back surface of the printed circuit board via through holes H11 and H12. The patterned line connected to the through holes H11 and the patterned line connected to the through holes H12 are maintained at the same potential.

In the conventional circuit shown in FIGS. 1 and 2, current is flowing through the loop circuits A11 and A12 alternately, for example, as the switching element Q is being turned on and off. Thus, a magnetic field penetrating through the loop circuit A11 and a magnetic field penetrating through the loop circuit A12 are generated alternately. The direction of the current flowing through the loop circuit A11 and the direction of the current flowing through the loop circuit A12 are opposite to each other as indicated by arrows shown in FIGS. 1 and 2. Thus, the direction of the magnetic field, relative to sheets of FIGS. 1 and 2, penetrating through the loop circuit A11 is opposite to the direction of the magnetic field, relative to sheets of FIGS. 1 and 2, penetrating through the loop circuit A12 according to the right-hand grip rule. Since the direction of the magnetic field is alternately changed by high-speed (short time) switching on/off of the switching element Q, high-frequency noise may be caused by fluctuation of the magnetic field in such a configuration.

Figure 3:
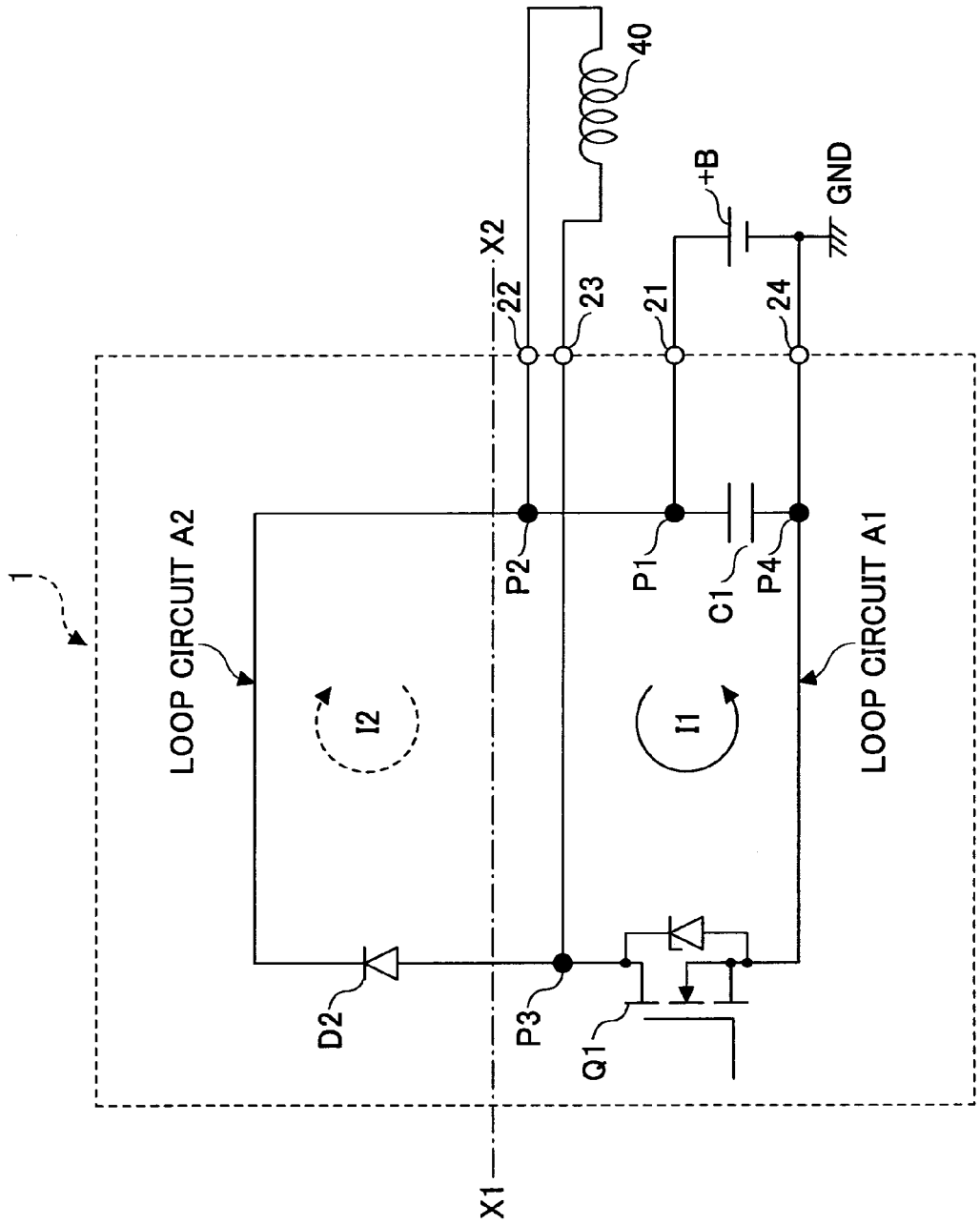
FIG. 3 shows a circuit configuration of a load drive apparatus according to an exemplary embodiment of the present invention.

FIG. 3 shows a circuit configuration of a load drive apparatus 1 according to an exemplary embodiment of the present invention. The circuit configuration of the load drive apparatus 1 according to the present embodiment is similar to the circuit configuration of the conventional load drive apparatus 11 shown in FIG. 1.

The load drive apparatus 1 includes a loop circuit A1 and a loop circuit A2. The loop circuit A1 constitutes a first loop circuit, and the loop circuit A2 constitutes a second loop circuit. The load drive apparatus 1 drives an inductive type electric load 40. The electric load 40 includes two ends, i.e. a first end and a second end. A first drive terminal 22 of the load drive apparatus 1 is connected to the first end of the electric load 40, and a second drive terminal 23 of the load drive apparatus 1 is connected to the second end of the electric load 40. The loop circuit A1 and the loop circuit A2 share an inductive component of the electric load 40.

The loop circuit A1 includes a switching element Q1 and a capacitor C1 in addition to the electric load 40 including an inductive component. In the loop circuit A1, a connecting point P1, a connecting point P2, an upstream side drive terminal 22, the electric load 40, a downstream side drive terminal 23, a connecting point P3, the switching element Q1, a connecting point P4 and the capacitor C1 are connected in this order. The connecting point P1 is connected to a power supply terminal 21 which is connected to the positive electrode of an electric power supply. The switching element Q1 may be comprised of, for example, a semiconductor element such as MOSFET (Metal Oxide Semiconductor Field Effect Transistor), or may be comprised of, for example, a transistor such as IGBT (Insulated Gate Bipolar Transistor). The capacitor C1 may be comprised of, for example, a multilayer ceramic capacitor (multilayer ceramic condenser) which is smaller than an electrolytic capacitor (electrolytic condenser) or a film capacitor (film condenser).

The drain of the switching element Q1 is connected to the drive terminal 23, which is connected to the downstream side of the electric load 40, at the connecting point P3. The source of the switching element Q1 is connected to a ground terminal 24, which is connected to ground (GND), at the connecting point P4.

The capacitor C1 which is connected to the electric load 40 in series is inserted into a current pathway of the loop circuit A1 in series. More specifically, the capacitor C1 is inserted in series into a looped current pathway of the current flowing through the loop circuit A1. One end of the capacitor C1 is connected to a first power supply line which is disposed upstream of the switching element Q1. The other end of the capacitor C1 is connected to a second power supply line which is disposed down stream of the switching element Q1. The electric potential of the first power supply line is higher than the electric potential of the second power supply line. For example, the first power supply line is connected to the positive electrode of a direct current power source, and the second power supply line is connected to ground. More specifically, one end of the capacitor C1 is connected to the power supply terminal 21 at the connecting point P1 and is further connected to the drive terminal 22, which is connected to the upstream side of the electric load 40 at the connecting point P2. The other end of the capacitor C1 is connected to ground terminal at the connecting point P4.

Since the series connection of the capacitor C1 and the electric load 40 forms an LC circuit, and the capacitor C1 is inserted into the current pathway of the loop circuit A1 in series, it becomes possible to use the multilayer ceramic capacitor, which has smaller capacitance and is smaller than the electrolytic capacitor, as the capacitor C1. Thus, it becomes possible to produce a sufficient noise reduction effect.

On the contrary, the loop circuit A2 includes a diode D2 in addition to the electric load 40 including the inductive component. In the loop circuit A2, the electric load 40, the drive terminal 23, the connecting point P3, the diode D2, the connecting point P2 and the drive terminal 22 are connected in this order.

The anode of the diode D2 is connected to the drive terminal 23 and the drain of the switching element Q1 at the connecting point P3. The cathode of the diode D2 is connected to the drive terminal 22, which is connected to the upstream side of the electric load 40, at the connecting point P2. The diode D2 is connected to the electric load 40 in parallel. The diode D2 blocks the current flowing into the loop circuit A2 from the power source (+B) as the switching transistor Q1 is being turned on, and passes the current flowing into the loop circuit A2 from the power source (+B) as the switching transistor Q1 is being turned off.

The power supply terminal 21 is connected to the positive electrode (+B) of the power source, and the ground terminal 24 is connected to ground (GND). The power supply terminal 21 constitutes a first power supply terminal which is maintained at higher potential, the power source constitutes a first direct current power source, and the ground terminal 24 constitutes a second power supply terminal which is maintained at lower potential. Herein, the ground terminal 24 may be connected to a second direct current power source of which the rated voltage is lower than that of the first direct current power source. In this case, the rated voltage of the first direct current power source and the rated voltage of the second direct current power source may be set to any voltage as long as the rated voltage of the first direct current power source is set to be higher than the rated voltage of the second direct current power source. Hereinafter, for ease of explanation, the embodiment in which the ground terminal 24 is connected to ground will be described, unless otherwise described.

The main function of the capacitor C1 is to reduce the noise of the load drive apparatus 1. It is preferable to use a ceramic type capacitor which has greater degradation resistance as the capacitor C1. Further, it becomes possible to downsize the load drive apparatus 1 by using the ceramic type capacitor.

The switching element Q1 is controlled to be turned on/off alternately. The cycle of turning on/off and the duty ratio of turning on/off may be set to any values.

According to the exemplary embodiment shown in FIG. 3, a current I1 is flowing through the loop circuit A1 in the direction of an arrow I1 as the switching element Q1 is being turned on. As the switching element Q1 is being turned off, current I2 is flowing through the loop circuit A2 in the direction of an arrow I2 shown in FIG. 3. In this way, it becomes possible to control the current flowing through the electric load 40 by controlling the on-duty ratio of the switching element Q1 appropriately.

Although, as described above, the load drive apparatus 1 shown in FIG. 3 is formed as a sink-type circuit, the switching apparatus of an embodiment of the present invention may be applied to a load drive apparatus which is formed a as source-type circuit.

Figure 4:
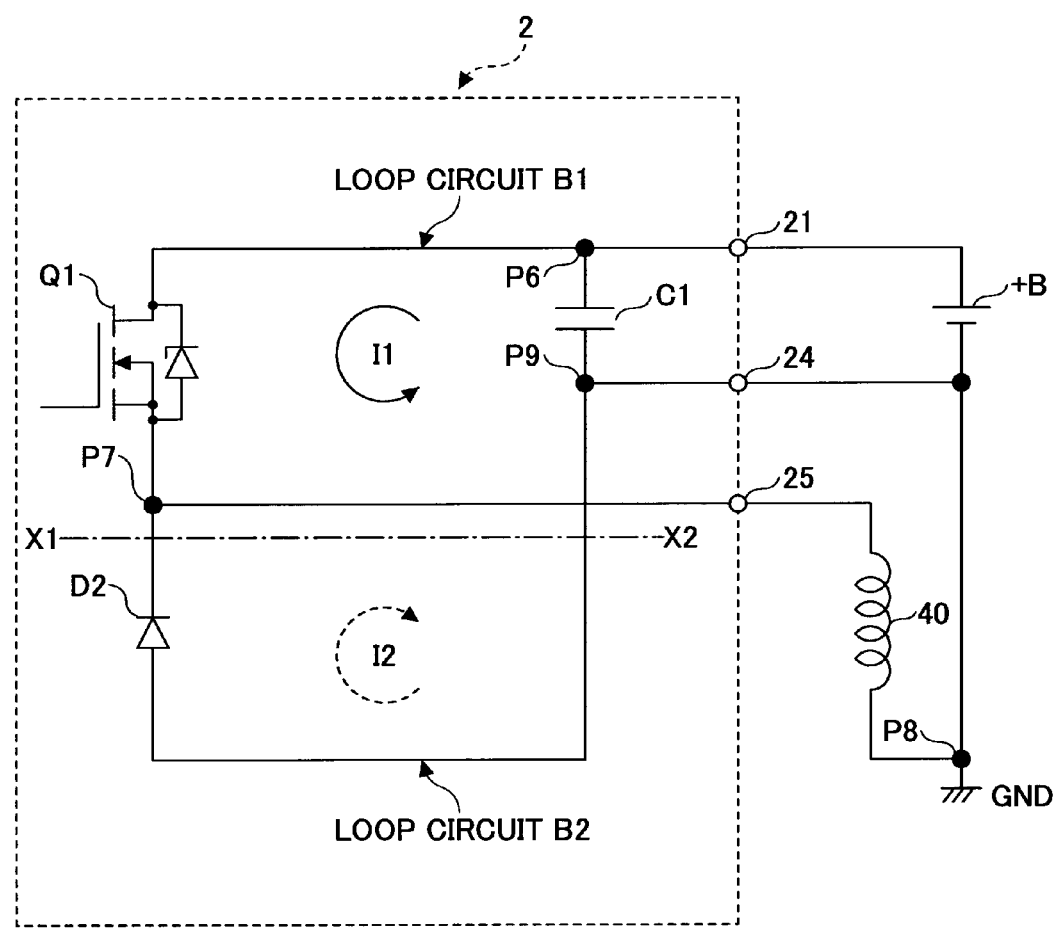
FIG. 4 shows a circuit configuration of a load drive apparatus according to another exemplary embodiment of the present invention.

As shown in FIG. 4, a load drive apparatus 2 includes a loop circuit B1 and a loop circuit B2. The loop circuit B1 constitutes the first loop circuit, and the loop circuit B2 constitutes the second loop circuit. A drive terminal 25 of the load drive apparatus 2 is connected to an upstream side terminal of the electric load 40. The upstream side terminal of the electric load 40 constitutes the first end. The downstream side terminal of the electric load 40 is connected to ground at a connecting point P8. The downstream side terminal of the electric load 40 constitutes the second end. The second end of the electric load 40 may be connected to ground terminal of the load drive apparatus 2. The loop circuit B1 and the loop circuit B2 share the inductive component of the electric load 40.

The loop circuit B1 includes the switching element Q1 and the capacitor C1 in addition to the electric load 40 including the inductive component. In the loop circuit B1, a connecting point P6, the switching element Q1, a connecting point P7, the upstream side drive terminal 25, the electric load 40, the connecting point P8, the ground terminal 24, a connecting point P9, and the capacitor C1 are connected in this order. The switching element Q1 may be comprised of, for example, a semiconductor element such as MOSFET, or may be comprised of, for example, a transistor such as IGBT. The capacitor C1 may be comprised of, for example, a multilayer ceramic capacitor.

The source of the switching element Q1 is connected to the drive terminal 25, which is connected to the upstream side of the electric load 40, at the connecting point P7. The drain of the switching element Q1 is connected to the power supply terminal 21, which is connected to the power source (+B), at the connecting point P6.

The capacitor C1 which is connected to the electric load 40 in series is inserted into a current pathway of the loop circuit B1 in series. More specifically, the capacitor C1 is inserted in series into a looped current pathway of the current flowing through the loop circuit B1. One end of the capacitor C1 is connected to the power supply terminal 21 and the drain of the switching element Q1 at the connecting point P6. The other end of the capacitor C1 is connected to ground at the connecting point P9.

Since the series connection of the capacitor C1 and the electric load 40 forms an LC circuit, and the capacitor C1 is inserted into the current pathway of the loop circuit B1 in series, it becomes possible to use the multilayer ceramic capacitor, which has smaller capacitance and is smaller than the electrolytic capacitor, as the capacitor C1. Thus, it becomes possible to produce a sufficient noise reduction effect.

On the contrary, the loop circuit B2 includes a diode D2 in addition to the electric load 40 including the inductive component. In the loop circuit B2, the electric load 40, the ground terminal 24, the connecting point P9, the diode D2, the connecting point P7 and the drive terminal 25 are connected in this order.

The cathode of the diode D2 is connected to the drive terminal 25 and the source of the switching element Q1 at the connecting point P7. The anode of the diode D2 is connected to the drive terminal 24, which is connected to the downstream side of the electric load 40, at the connecting point P9. The diode D2 is connected to the electric load 40 in parallel.

The main function of the capacitor C1 is to reduce the noise of the load drive apparatus 2. It is preferable to use a ceramic type capacitor which has greater degradation resistance as the capacitor C1. Further, it becomes possible to downsize the load drive apparatus 2 by using the ceramic type capacitor.

The switching element Q1 is controlled to be turned on/off alternately. The cycle of turning on/off and the duty ratio of turning on/off may be set to any values.

According to the exemplary embodiment shown in FIG. 4, a current I1 is flowing through the loop circuit B1 in the direction of an arrow I1, as the switching element Q1 is being turned on. As the switching element Q1 is being turned off, a current I2 is flowing through the loop circuit B2 in the direction of an arrow I2 shown in FIG. 4. In this way, it becomes possible to control the current flowing through the electric load 40 by controlling the duty ratio of the switching element Q1 appropriately.

As described above with reference to FIGS. 1 and 2, if the load drive apparatus 1 shown in FIG. 3 or the load drive apparatus 2 shown in FIG. 4 is disposed in a planar configuration, a problem of the high-frequency noise caused by high-frequency fluctuation of the magnetic field penetrating through the loop circuit A1 (B1) and the magnetic field penetrating through the loop circuit A2 (B2) may be occur as the switching element Q1 is being turned on/off at high frequency.

According to the present embodiment, it becomes possible to reduce the noise effectively, which noise is caused by the fluctuation of the magnetic field occurring in the loop circuits A1 and A2, by arranging the circuit configuration of the load drive apparatus 1 appropriately. Hereinafter, the detailed circuit configuration of the load drive apparatus 1 will be described. Since the detailed circuit configuration of the load drive apparatus 2 is similar to the circuit configuration of the load drive apparatus 1, the detailed description of the circuit configuration of the load drive apparatus 2 is omitted.

Figure 5:
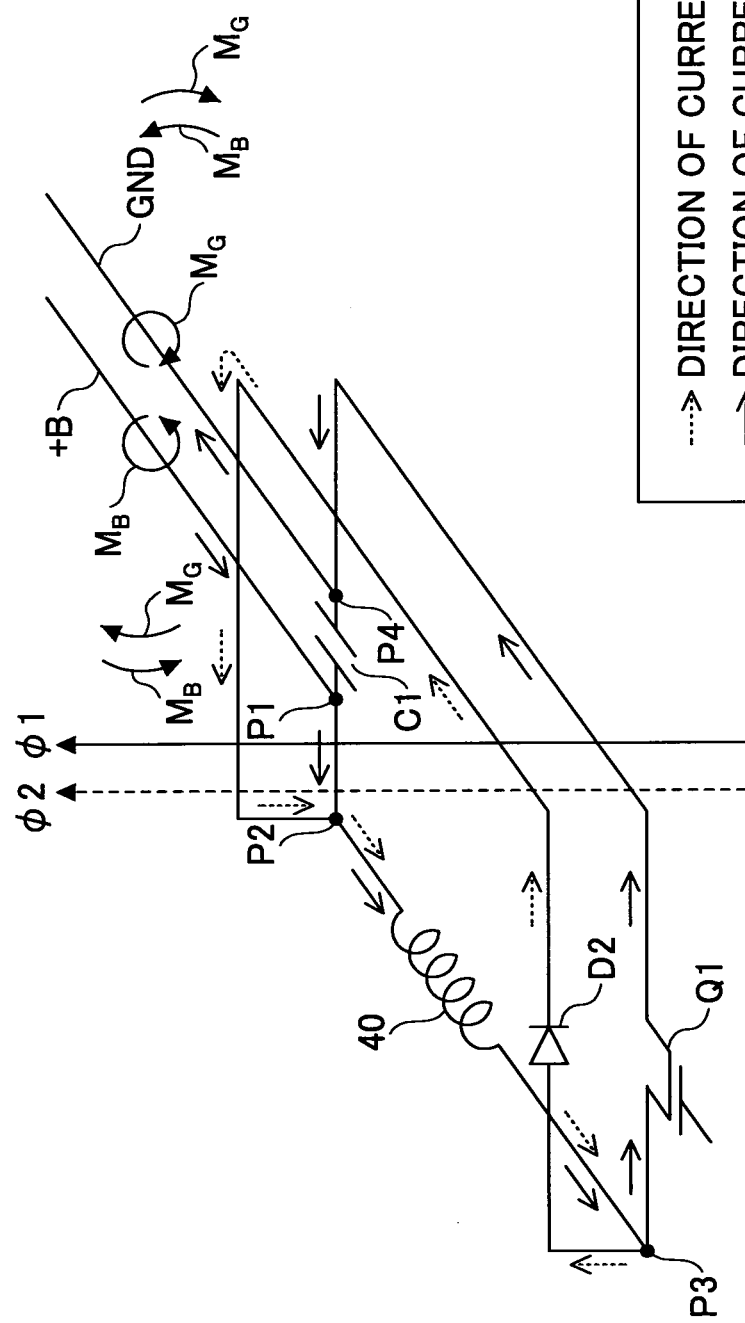
FIG. 5 shows a circuit configuration of the load drive apparatus according to the present embodiment.

FIG. 5 shows a circuit configuration of the load drive apparatus 1 according to the present embodiment. Herein, magnetic flux, which is penetrating through the current pathway of the loop circuit A1 on one surface of the printed circuit board, is referred to as magnetic flux $\phi 1$, and magnetic flux, which is penetrating through the current pathway of the loop circuit A2 on the other surface of the printed circuit board, is referred to as magnetic flux $\phi 2$. According to the present embodiment, the circuit configuration of the load drive apparatus 1 is arranged so that the magnetic flux $\phi 1$ and the magnetic flux $\phi 2$ head in the same direction. In other words, as shown in FIG. 5, a plane including the current pathway of the loop circuit A1 on the surface of the printed circuit board, and a plane including the current pathway of the loop circuit A2 on the surface of the printed circuit board, are stacked relative to each other in the direction of normal lines of the two surfaces. In addition to this, the looped current pathways in the stacked loop circuits have the same direction. The current pathway of the loop circuit A1 on one surface of the printed circuit board and the current pathway of the loop circuit A2 on the other surface of the printed circuit board are arranged to be stacked relative to each other in a manner arranged by bending the current pathways along line X1-X2 shown in FIG. 3. The circuit configuration of the load drive apparatus 2 is similar to the circuit configuration of the load drive apparatus 1.

As shown in FIG. 5, the capacitor C1 is connected between the connecting point P1 connected to the power supply terminal 21, and the connecting point P4 connected to the ground terminal 24. The capacitor C1 functions as a bypass circuit for the noise occurring in the loop circuits in the load drive apparatus 1. The capacitor C1 suppresses leakage of the noise, in a normal operation, out of the load drive apparatus 1 via the wire harnesses connected to the power supply terminal 21 and the ground terminal 24.

The load drive apparatus 1 includes a parallel section in which a first current pathway and a second current pathway are arranged in parallel. The first current pathway is located on the upstream side of the switching element Q1, and the current flows through it as the switching element Q1 is being turned on. The second current pathway is located on the downstream side of the switching element Q1, and the current flows through it as the switching element Q1 is being turned on. The parallel section includes an opposite current flowing section. In the opposite current flowing section, the direction of the current flowing through the first current pathway is opposite to the direction of the current flowing through the second current pathway. Thus, it becomes possible to suppress the noise occurring near the opposite current flowing section by arranging the opposite current flowing section.

For example, as shown in FIGS. 3 and 5, the first current pathway corresponds to the current pathway between the positive electrode of the power source (+B) and the drive terminal 22. The first current pathway also includes the wire harness between the positive electrode of the power source and the power supply terminal 21. The second current pathway corresponds to the current pathway between the downstream side terminal of the switching element Q1 and ground. The second current pathway also includes the wire harness between the ground terminal 24 and ground. In FIG. 4, for example, the first current pathway corresponds to the current pathway between the positive electrode of the power source (+B) and the upstream side of the switching element Q1. The first current pathway also includes the wire harness between the positive electrode of the power source and the power supply terminal 21. The second current pathway corresponds to the current pathway between the downstream side of the switching element Q1 and ground. The second current pathway also includes the wire harness between the drive terminal 25 and ground (or the electric load 40).

As shown in FIG. 5, as the switching element is being turned on, the direction of the current flowing from the positive electrode of the power source to the load drive apparatus 1 is opposite to the direction of the current flowing from the load drive apparatus 1 to ground. Magnetic fields $M_B$ and $M_G$ are generated around the current pathways in the direction of arrows shown in FIG. 5 by causing the currents to flow through the parallel section in opposite directions to each other. Thus, the noises (mainly switching noises generated by the switching of the switching element) generated from the respective current pathways in the parallel section are reduced by cancelling the noises with each other.

As shown in FIG. 5, in the right side area of the opposite current flowing section, the direction of the magnetic fields $M_B$ and the direction of the magnetic fields $M_G$ are opposite to each other, i.e. upward and downward. It becomes possible to reduce the intensity of the magnetic field in the right side area of the opposite current flowing section shown in FIG. 5. The same applies to the left side area of the opposite current flowing section shown in FIG. 5. Thus, it becomes possible to reduce the intensity of the magnetic field in the whole area around the opposite current flowing section. Accordingly, it becomes possible to produce a noise reduction effect in a case where a signal line for transmitting a predetermined signal is disposed in the area around the opposite current flowing section. For example, it becomes possible to provide the noise reduction effect to a signal line which is tied together with the wire harness connected to the power supply terminal 21 and the wire harness (ground wire harness) connected to the ground terminal 24.

Herein, the opposite current flowing section may be formed outside the load drive apparatus 1, or may be formed inside the load drive apparatus 1 by arranging two adjacent patterned lines in parallel.

The capacitor C1 controls the current flowing through the electric load 40 at a predetermined switching frequency f1, i.e. the capacitor C1 holds a PWM waveform of the current which controls the electric load 40 in the PWM manner, in order to cause the current flowing through the two loop circuits at a frequency f2 which is to be cancelled. Thus, it is necessary that the capacitance C of the capacitor C1 be set at a value which satisfies the conditional expression (1) described below. The relational expression (2) is obtained by solving the conditional expression (1).

$$f_1 << \frac{1}{2\pi\sqrt{LC}}, f_2 \approx \frac{1}{2\pi\sqrt{LC}} \quad (1)$$

$$C \approx \frac{1}{4\pi^2 f_2^2 L} << \frac{1}{4\pi^2 f_1^2 L} \quad (2)$$

Since most switching noise becomes a problem at higher frequency, $f_1 < f_2$, i.e. $f_1^2 << f_2^2$ is established. It is possible to cause the current to flow through the loop circuits at the noise frequency f2 while holding the PWM waveform of the current by selecting the capacitance C which satisfies the first term of the relational expression (2). Thus, it becomes possible to design a circuit which reduces noise.

Figure 6:
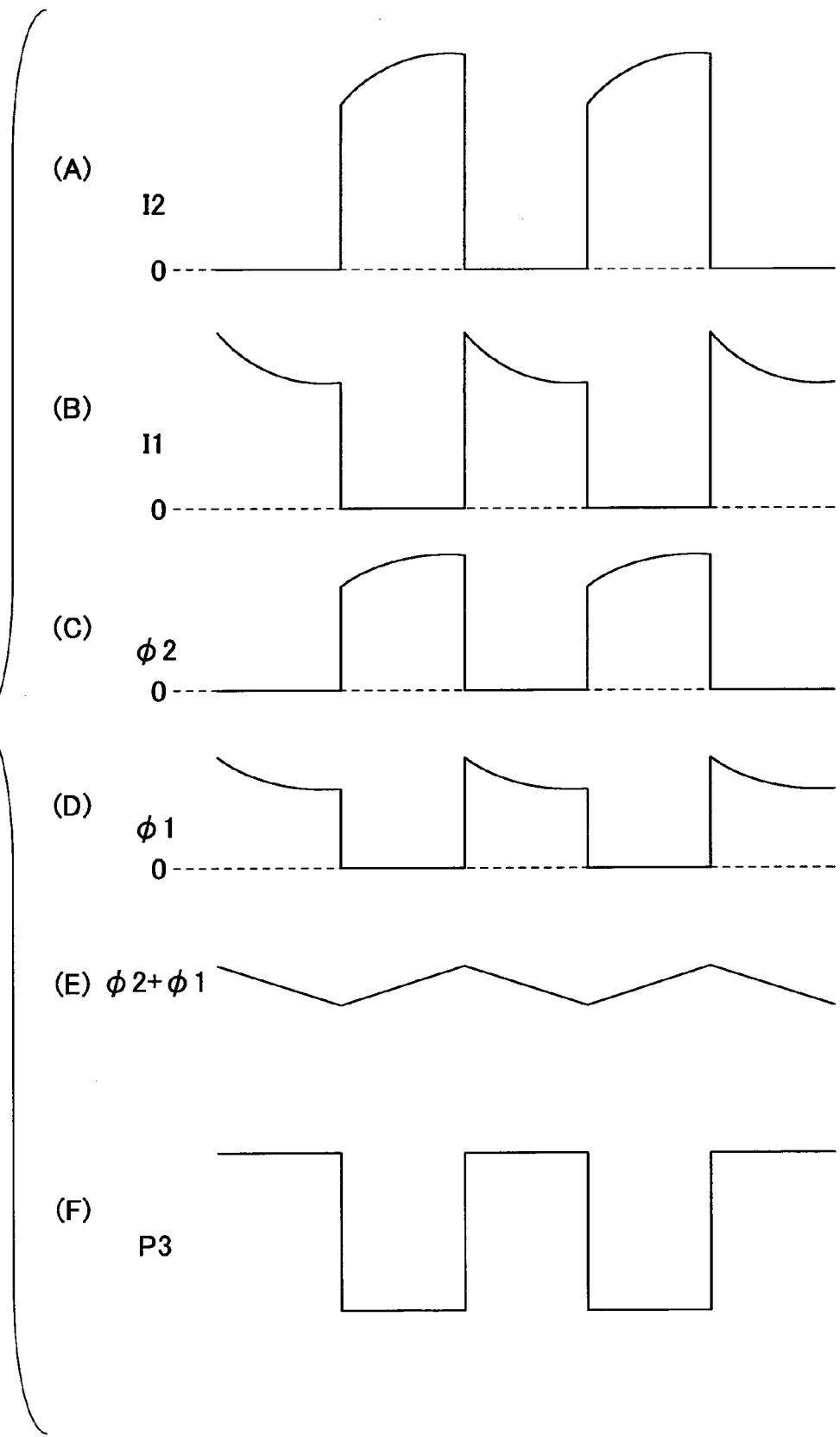
FIG. 6 shows waveforms which represent a reduced fluctuation effect of magnetic flux in a load drive apparatus including the circuit configuration shown in FIG. 5.

FIG. 6 shows waveforms which represent reduced fluctuation effect of magnetic flux in the load drive apparatus 1 including the circuit configuration shown in FIG. 5.

As described above, as the switching element Q1 is being driven at a predetermined duty ratio, the current holding the waveforms shown in FIGS. 6(A) and 6(B) is flowing through the loop circuits A1 and A2. Then the voltage at the connecting point P3 fluctuates and has waveforms shown in FIG. 6(F). Then the magnetic fluxes φ1 and φ2, which are penetrating the loop circuits A1 and A2 respectively, are generated and have waveforms shown in FIGS. 6(C) and 6(D). The magnetic fluxes φ1 and φ2 are caused by the currents flowing through the loop circuits A1 and A2. Since the switching element Q1 is driven at a higher frequency, the magnetic fluxes φ1 and φ2 fluctuate greatly in a short time. According to the present embodiment, the magnetic flux φ1 and the magnetic flux φ2 have opposite phases. Thus, as shown in FIG. 6(E), composite waveforms of the magnetic flux φ1 and the magnetic flux φ2 do not include steep fluctuation. The magnetic flux with small scale temporal variation is obtained. According to the load drive apparatus 1 including the circuit configuration shown in FIG. 5, it becomes possible to reduce the noise caused by the magnetic flux φ1 and magnetic flux φ2.

Figure 7A:
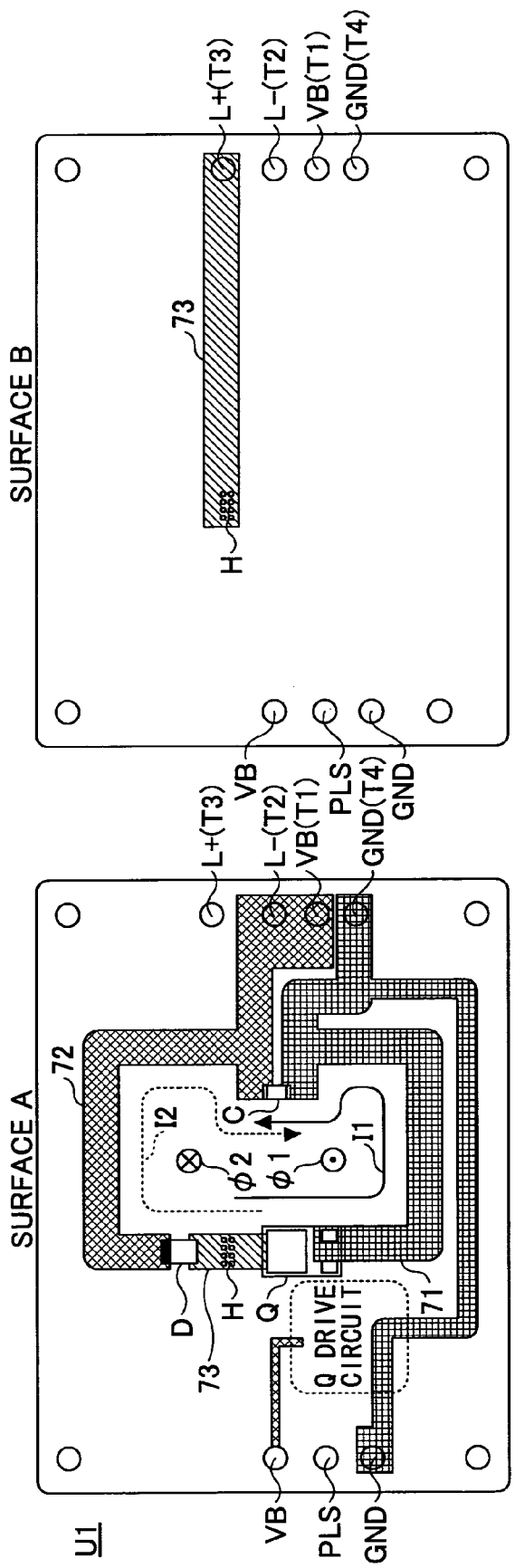
FIG. 7A shows a circuit unit U1 including the conventional load drive apparatus.
Figure 7B:
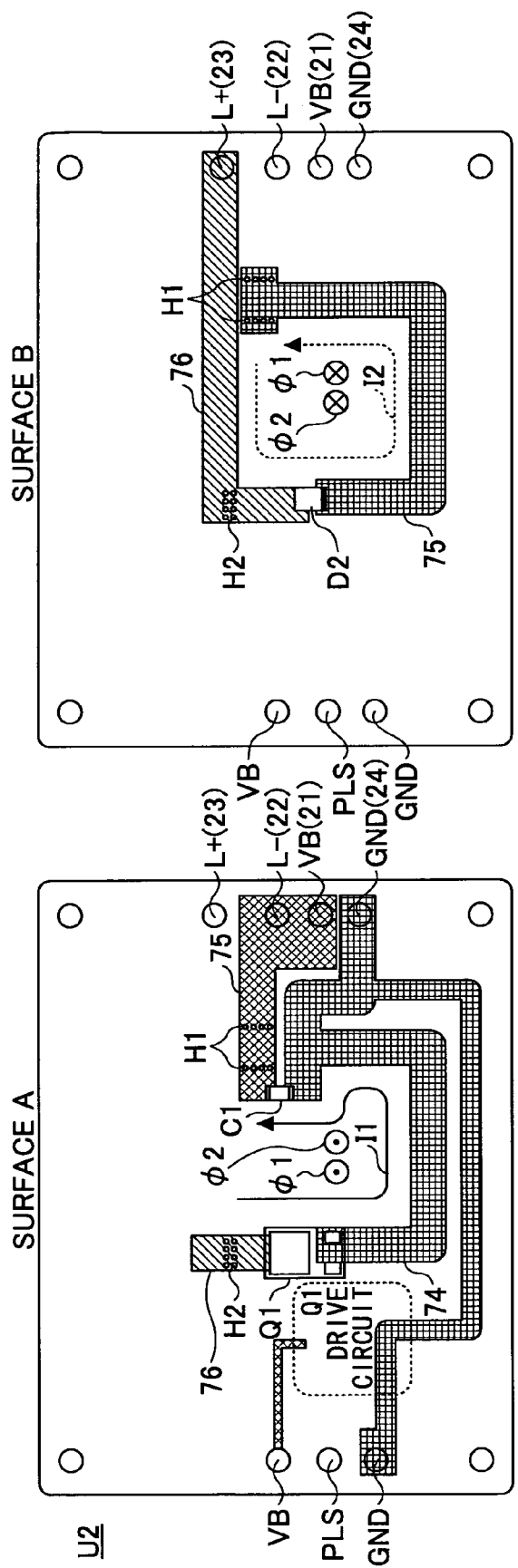
FIG. 7B shows a circuit unit U2 including the load drive apparatus 1 according to the present embodiment.

FIG. 7A shows a circuit unit U1 including the conventional load drive apparatus. FIG. 7B shows a circuit unit U2 including the load drive apparatus 1 according to the present embodiment. In FIGS. 7A and 7B, surface A shows the top surface of the printed circuit board, and surface B shows the bottom surface of the printed circuit board. In FIG. 7A, elements which correspond to the elements shown in FIG. 1 are referred to by the same reference numerals. In FIG. 7B, elements which correspond to the elements shown in FIG. 3 are referred to by the same reference numerals. In FIGS. 7A and 7B, reference numerals 71~76 show planar current pathways formed on the top surface and the bottom surface. The current pathways constitute patterned lines.

As shown in FIG. 7A, the current pathway 71 corresponds to a part of the loop circuit A11 shown in FIG. 1, and constitutes a patterned ground line which connects the downstream side of the switching element Q and one side terminal of the capacitor C. The current pathway 72 corresponds to a part of the loop circuit A12 shown in FIG. 1, and constitutes a patterned line which connects the anode of the diode D and the upstream side of the electric load 40. The current pathway 73 corresponds to the patterned line between the connecting point P12 and the terminal T3 which is shared between the loop circuit A11 and the loop circuit A12. The current pathway 73 is formed on the top surface and the bottom surface of the printed circuit board via a through-hole H.

In FIG. 7B, the current pathway 74 corresponds to a part of the loop circuit A1 shown in FIG. 3, and constitutes a patterned ground line which connects the downstream side of the switching element Q1 and one side terminal of the capacitor C1. The current pathway 75 corresponds to a part of the loop circuit A2 shown in FIG. 3, and constitutes a patterned line which connects the anode of the diode D2 and the upstream side of the electric load 40. The current pathway 75 is formed on the top surface and the bottom surface of the printed circuit board via a through-hole H1. The current pathway 76 corresponds to the patterned line between the connecting point P3 and the terminal 23 which is shared between the loop circuit A1 and the loop circuit A2. The current pathway 76 is formed on the top surface and the bottom surface of the printed circuit board via a through-hole H2.

In the circuit U1 shown in FIG. 7A, the current is flowing through the patterned line 71 and the patterned line 72 alternately. The direction of the magnetic flux φ1 generated by the current flowing through the patterned line 71 is opposite to the direction of the magnetic flux φ2 generated by the current flowing through the patterned line 72. On the contrary, in the circuit U2 shown in FIG. 7B, the current is flowing through the patterned line 74 and the patterned line 75 alternately. The direction of the magnetic flux φ1 generated by the current flowing through the patterned line 74 is the same as the direction of the magnetic flux φ2 generated by the current flowing through the patterned line 75.

Figure 8:
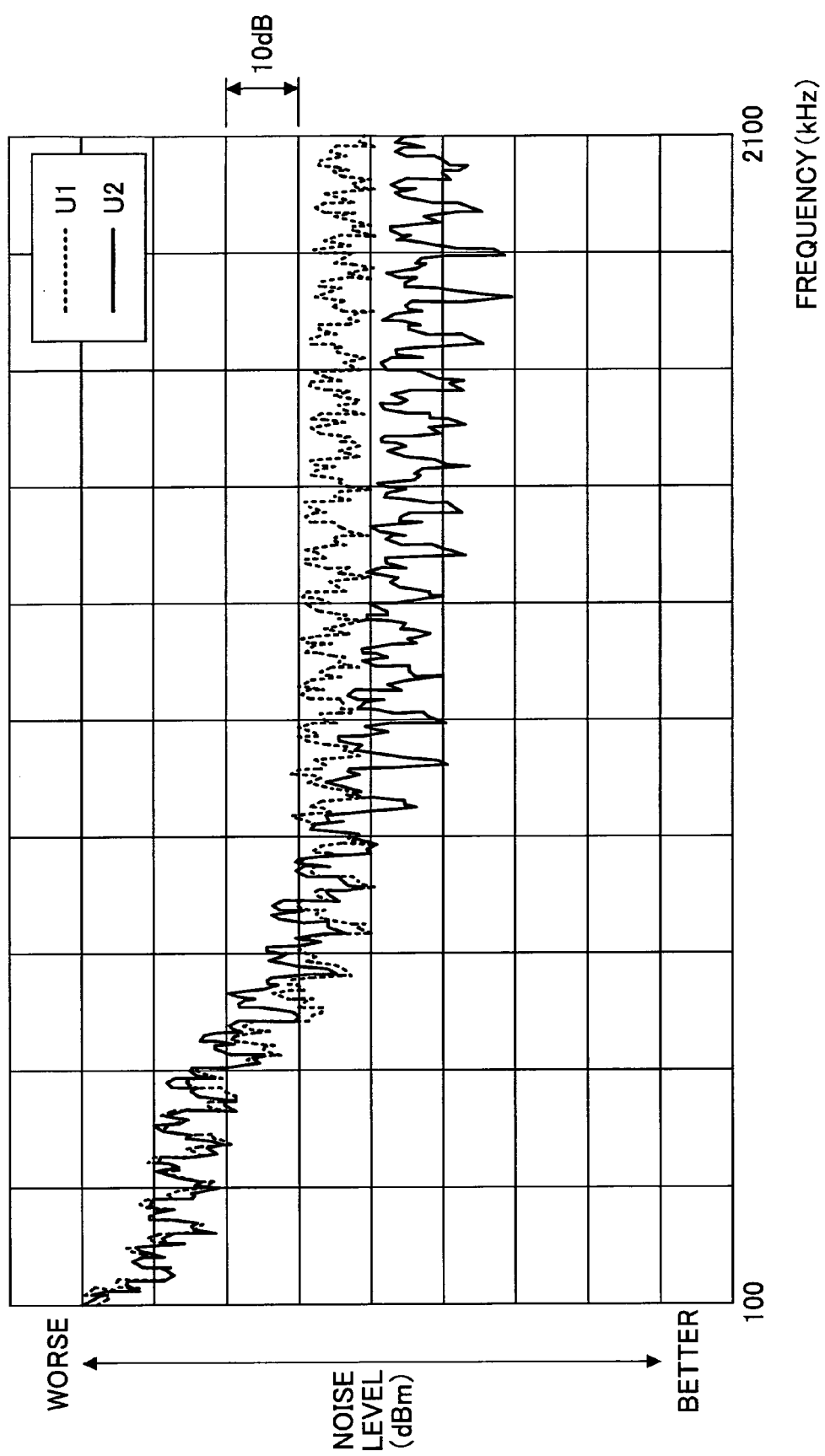
FIG. 8 shows noise levels detected in the circuit units U1 and U2 shown in FIGS. 7A and 7B.

FIG. 8 shows noise levels detected in the circuit units U1 and U2 shown in FIGS. 7A and 7B. The noise levels shown in FIG. 8 are obtained in a condition where the switching elements Q and Q1 are turned on and off at 20 kHz. A single scale in the horizontal axis corresponds to 200 kHz, and a single scale in the vertical axis corresponds to 10 dB. As shown in FIG. 8, the noise level of the circuit unit U2 according to the present embodiment is reduced compared with the conventional circuit unit U1, particularly in the AM range.

In the circuit unit U2, the direction of the magnetic flux φ1 and the direction of the magnetic flux φ2 are the same as each other, and the patterned line 74 and the patterned line 75 of the circuit unit U2 are closely formed on the surface A and surface B. It becomes easier to form the composite magnetic flux of magnetic fluxes φ1 and φ2 in the circuit unit U2. Thus, it becomes possible to reduce the noise generated by the magnetic fluxes.

It is not necessary to form the whole current pathway of the loop circuit A1 on the surface which is opposite to the surface on which the whole current pathway of the loop circuit A2. A part of the current pathway included in the loop circuit A1 or a part of the current pathway included in the loop circuit A2 may be formed on another surface or another layer of the printed circuit board. Further, a part of the loop circuit A1 (particularly the patterned line) or a part of the loop circuit A2 (particularly the patterned line) may be formed on another surface or another layer of the printed circuit board. For example, as shown in FIG. 7B, a part of the loop circuit A2 may be formed on the same surface on which the loop circuit A1 is formed. On the contrary, a part of the loop circuit A1 may be formed on the same surface on which the loop circuit A2 is formed. The printed circuit board is not limited to a specific printed circuit board.

Figure 9:
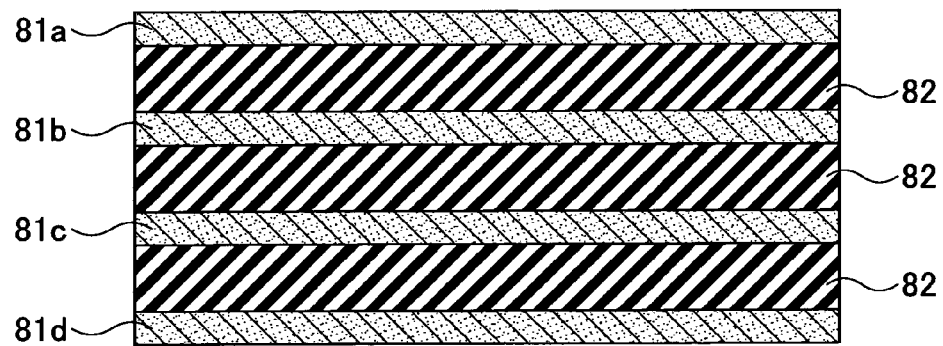
FIG. 9 shows a cross section of an exemplary configuration of a four-layer printed circuit board.

The patterned lines included in loop circuits A1 and A2 may be formed on any layer of a multilayer printed circuit board. FIG. 9 shows a cross section of an exemplary configuration of a four-layer printed circuit board. Adjacent four layers are insulated from each other by insulating layers 82. For example, the patterned lines of the loop circuit A1 may be formed on a second layer 81b, and the patterned lines of the loop circuit A2 may be formed on a third layer 81c. In another exemplary embodiment, the patterned lines of the loop circuit A1 may be formed on a first layer 81a, and the patterned lines of the loop circuit A2 may be formed on the third layer 81c. Although the number of the multilayers is not limited to four, it becomes possible to obtain a greater noise reduction effect by forming the loop circuits A1 and A2 on adjacent layers.

Figure 10:
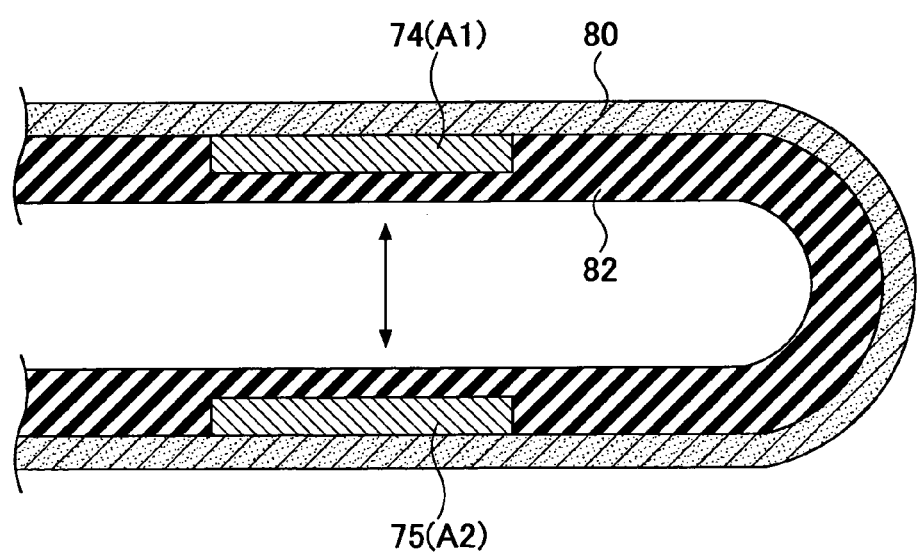
FIG. 10 shows another exemplary circuit configuration of the load drive apparatus 1.

FIG. 10 shows another exemplary circuit configuration of the load drive apparatus 1.

In an exemplary circuit configuration shown in FIG. 10, a flexible substrate 80, on which the patterned line 74 and the patterned line 75 are formed, is bent so that the patterned line 74 and the patterned line 75 are arranged to be stacked with each other. Herein, the patterned line 74 forms the loop circuit A1, and the patterned line 75 forms the loop circuit A2. Thus, the loop circuit A1 and the loop circuit A2 are arranged to be stacked with each other. The loop circuit A1 and the loop circuit A2 are arranged so that the direction of the magnetic flux generated from the loop circuit A1 corresponds to the direction of the magnetic flux generated from the loop circuit A2. The insulating layer 82 is formed on the loop circuits A1, A2 and the flexible substrate 80. Thus, the loop circuits A1 and A2 (particularly the power supply terminal and ground terminal) are insulated from each other.

Figure 11:
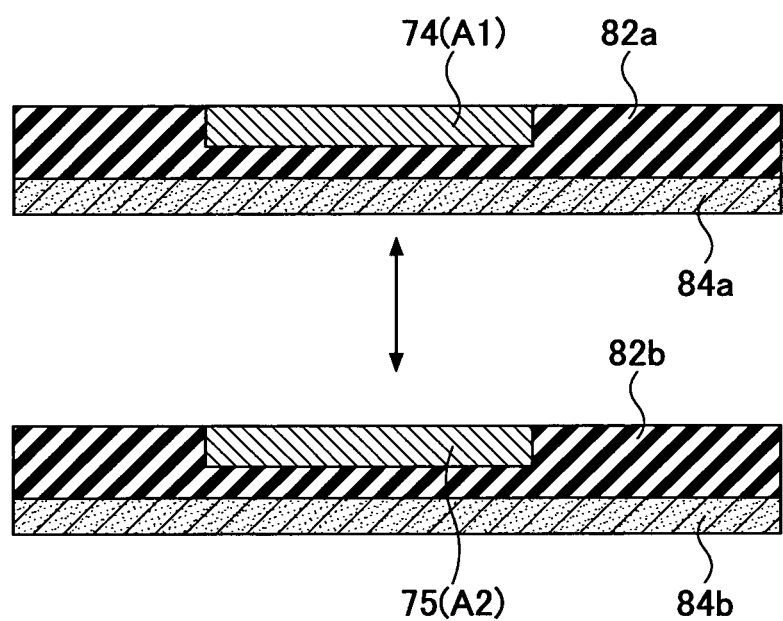
FIG. 11 shows yet another exemplary circuit configuration of the load drive apparatus 1.

FIG. 11 shows yet another exemplary circuit configuration of the load drive apparatus 1. As shown in FIG. 11, the patterned line 74 of the loop circuit A1 and the patterned line 75 of the loop circuit A2 are formed on different substrates 84a and 84b, and the substrates 84a and 84b are stacked with each other. The loop circuit A1 and the loop circuit A2 are arranged so that the direction of the magnetic flux generated from the loop circuit A1 corresponds to the direction of the magnetic flux generated from the loop circuit A2. The insulating layer 82a is formed on the patterned line 74 and the substrate 84a. The insulating layer 82b is formed on the patterned line 75 and the substrate 84b. Thus, the patterned line 74 and the patterned line 75 are insulated from each other. In this case, the patterned line 76, which is shared between the loop circuit A1 and the loop circuit A2 is formed on either the substrate 84a or the substrate 84b. The substrates 84a and 84b may be comprised of printed circuit board, flexible substrate or ceramic substrate.

In the exemplary circuit configuration shown in FIG. 11, the substrate 84a, on which the patterned line 74 and the insulating layer 82a are formed, and the substrate 84b, on which the patterned line 74 and the insulating layer 82a are formed, are stacked directly. The substrate 84a and the substrate 84b may be stacked indirectly, i.e. the substrate 84a, one or more other layers and the substrate 84b may be stacked in this order. Further, one or more other layers may be stacked on the substrate 84*a*. The substrate 84*a* and the substrate 84*b* may be stacked over one or more other layers. It becomes possible to improve noise resistance by forming conductive material such as copper on the whole surface of other layers stacked on the substrate 84*a* or stacked under the substrate 84*b*.

The load drive apparatus 1 according to the above embodiments includes the loop circuits which reduce fluctuation of the magnetic fluxes generated therefrom as the switching element is being turned on/off. Thus, it becomes possible to reduce radio noise generated by switching the switching element. According to the above embodiments, two loop circuits share the same inductive component of the electric load.

In accordance with the present invention according to the embodiments described above, it becomes possible to reduce high-frequency noise by improving the circuit configuration of the switching apparatus.

Although the load drive apparatus 1 according to the above embodiments drives the electric load 40 including the inductive component, the load drive apparatus 1 may drive a motor such as a motor including brushes, a brushless motor, a stepping motor, a three-phase motor and a linear motor. Further, the load drive apparatus 1 may drive a linear solenoid and an electromagnetic valve. In a case where the load drive apparatus 1 is integrated with a control unit such as an ECU (Electronic Control Unit) and an actuator, the greater noise reduction effect is obtained. In this case, degradation of the noise resistance caused by the integration of the ECU and the actuator is suppressed.

The load drive apparatus 1 may be widely applied to an electronic apparatus which controls current flowing through an electric load including an inductive component. The electronic apparatus described above may include an ECU for controlling a motor of radiator cooling fan, an ECU for fuel control, an ECU for controlling a motor for electric power steering, an ECU for controlling an electric seat, an ECU for controlling electric windows, an ECU for controlling brightness of head lights, an ECU for controlling a motor of a haptic apparatus, an ECU for controlling a motor of a slide door, an ECU for controlling an air conditioner, an ECU for controlling a motor of windshield wiper, an ECU for controlling a blower motor and an ECU for controlling a motor included in a transmission. In a case where the load drive apparatus 1 is applied to a plurality of the electronic apparatus as described above, it becomes possible to obtain greater noise reduction effect in a vehicle. Since the noise reduction effect can be obtained without adding an element or a component, it becomes possible to avoid weight gain. Thus, it becomes possible to provide the load drive apparatus 1 which is easy to apply to the electronic apparatuses mounted on a vehicle.

Although it is preferable that the loop circuits A1 and A2 have the same areas through which the magnetic flux penetrates, the loop circuits A1 and A2 may have different areas, particularly in a case where it is difficult to obtain the same areas because of restriction of design. Similarly, it is preferable that the loop circuits A1 and A2 have larger overlap areas in planer view, and the loop circuits A1 and A2 may have an overlap area in a small part.

The patterned lines included in the loop circuits A1 and/or A2 may have a rounded portion in a turning portion in order to reduce noise generated from the turning portion.

Further, at least a part of the current pathway of the loop circuits A1 and/or A2 may be formed by a cable core of a coaxial cable. In this case, it is possible to suppress magnetic flux from the current pathway.

The edge portion of the printed circuit board may be coated with insulating material in a manner coated twice or coated by dipping, in a case where both of the current pathways of the upstream side portion and downstream side portion are arranged close to the edge portion of the printed circuit board. Both of the current pathways of the upstream side portion and downstream side portion may be arranged in a center portion of the printed circuit in planar view in order to lengthen the distance between the upstream side portion and the downstream side portion. Similarly, both of the current pathways of the upstream side portion and the downstream side portion are arranged apart from the through hole in planar view in order to lengthen the distance between the upstream side portion and the downstream side portion.

Figure 12:
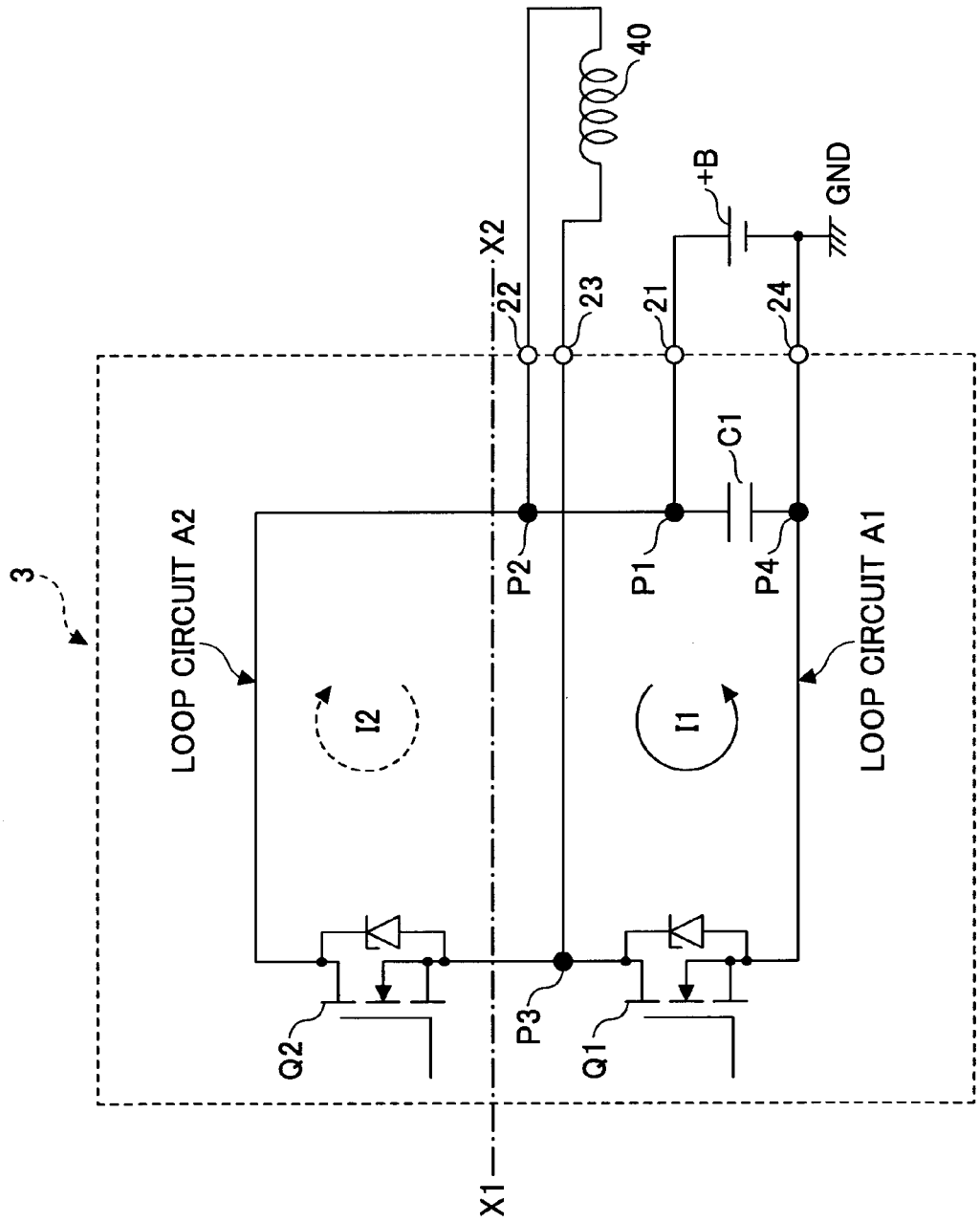
FIG. 12 shows a load drive apparatus 1 including a switching element Q2 instead of the diode D2 shown in FIG. 3.
Figure 13:
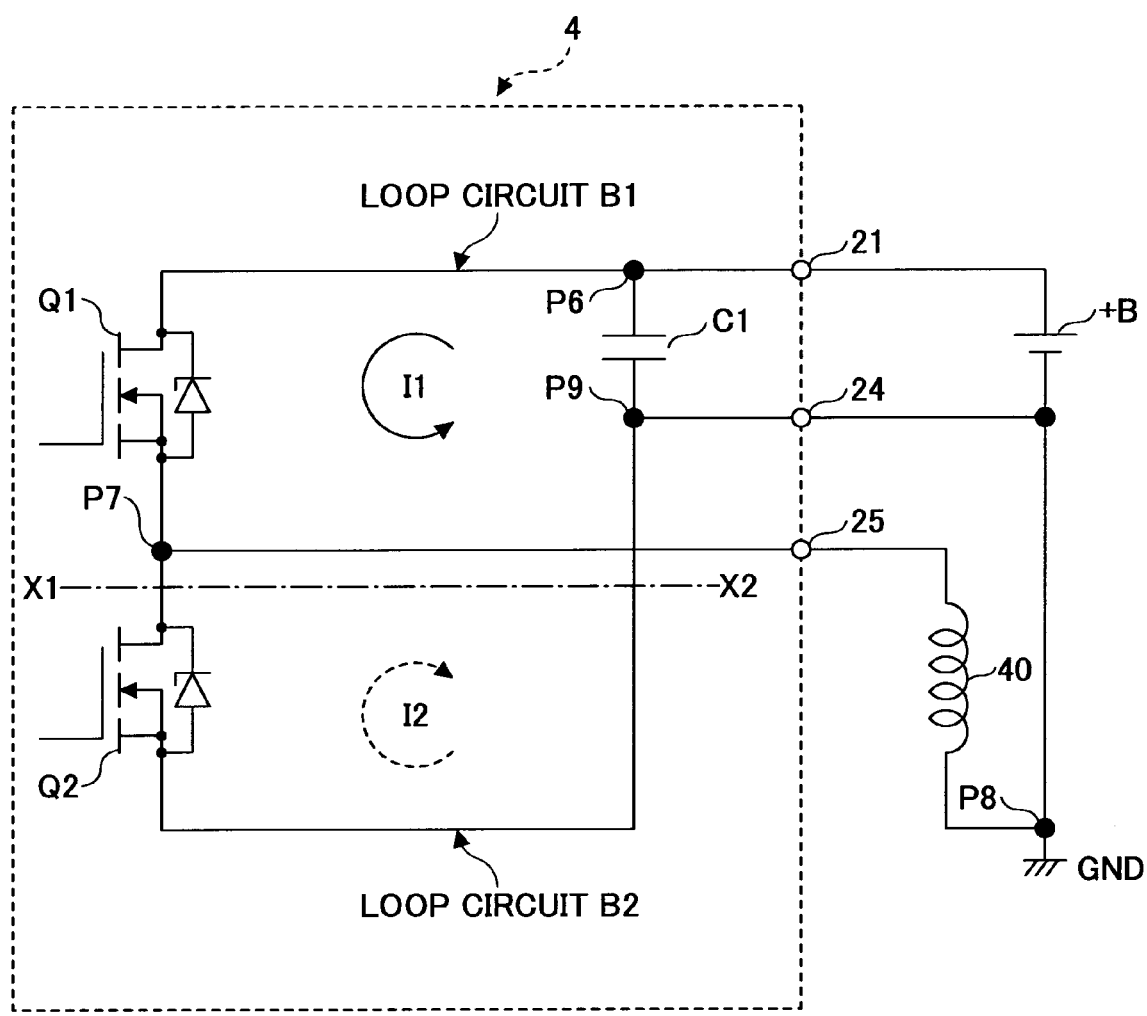
FIG. 13 shows a load drive apparatus 2 including a switching element Q2 instead of the diode D2 shown in FIG. 4.

The diode D2 included in the load drive apparatus 1 shown in FIG. 3 may be replaced by a switching element Q2 as shown in FIG. 12. The diode D2 included in the load drive apparatus 2 shown in FIG. 4 may be replaced by a switching element Q2 as shown in FIG. 13. In these cases, the switching element Q1 and the switching element Q2 are alternately turned on and off in an opposite manner. The switching element Q2 is used as a rectifier element. Control conditions of the switching elements Q1 and Q2 such as with or without dead time, length of the dead time or the like are arbitrarily defined.

The present invention is not limited to these embodiments, but variations and modifications may be made without departing from the scope of the present invention.

The present application is based on Japanese Priority Application No. 2009-169383 filed on Jul. 17, 2009 with the Japanese Patent Office, the entire contents of which are hereby incorporated by reference.

The invention claimed is:

1. A switching apparatus comprising:
   a first loop circuit configured to include a switching element, an inductive component and a capacitor; and
   a second loop circuit configured to share the inductive component with the first loop circuit,
   wherein the capacitor is inserted in series with the inductive component in the first loop, wherein the switching apparatus controls respective currents flowing through the first loop circuit and the second loop circuit in an alternating manner by turning on/off the switching element in order to control the current flowing through the inductive component,
   wherein a first magnetic flux generated by the current flowing through the first loop circuit as the switching element is being turned on and a second magnetic flux generated by the current flowing through the second loop circuit as the switching element is being turned off head in the same direction,
   wherein the first loop circuit and the second loop circuit are stacked with each other in a direction of normal lines of the first and second loop circuits, and
   wherein the normal lines penetrate the first and second loop circuits.

2. The switching apparatus according to claim 1, wherein the first loop circuit and the second loop circuit are formed respectively on different layers of a substrate.

3. The switching apparatus according to claim 2, wherein the first loop circuit is formed on the top surface of the substrate and the second loop circuit is formed on the bottom surface of the substrate.

4. The switching apparatus according to claim 2, wherein the substrate is configured as a multilayer substrate, and wherein one of the first loop circuit and the second loop circuit is formed in a middle layer of the multilayer substrate.

5. The switching apparatus according to claim 2, wherein the substrate is configured as a flexible substrate, and wherein the flexible substrate is bent so that the first loop circuit and the second loop circuit are stacked with each other in the direction of normal lines of the first and second loop circuits.

6. The switching apparatus according to claim 1, wherein one end of the capacitor is connected to a first power supply line configured as an upstream side line of the switching element, and the other end of the capacitor is connected to a second power supply line configured as a downstream side line of the switching element.

7. The switching apparatus according to claim 1, further comprising;
a first current pathway configured to be connected to an upstream side of the switching element, and configured to cause current to flow therethrough as the switching element is being turned on, and
a second current pathway configured to be connected to a downstream side of the switching element and to be arranged in parallel with the first current pathway; and wherein the second current pathway is further configured to cause current to flow therethrough as the switching element is being turned on,
wherein a first direction of the current flowing through the first current pathway is opposite to a second direction of the current flowing through the second current pathway.

8. The switching apparatus according to claim 7, wherein the first direction of the current flowing through the first current pathway is opposite to the second direction of the current flowing through the second current pathway so that a first noise generated at the first current pathway and a second noise generated at the second current pathway cancel with each other.

9. A switching apparatus comprising:
a first loop circuit configured to include a switching element, an inductive component and a capacitor;
a second loop circuit configured to share the inductive component with the first loop circuit;
a first current pathway configured to be connected to an upstream side of the switching element, and configured to cause current to flow therethrough as the switching element is being turned on; and
a second current pathway configured to be connected to a downstream side of the switching element and to be arranged in parallel with the first current pathway, and wherein the second current pathway is further configured to cause current to flow therethrough as the switching element is being turned on,
wherein the capacitor is inserted in series with the inductive component in the first loop circuit, wherein the switching apparatus controls respective current flowing through the first loop circuit and the second loop circuit in an alternating manner by turning on/off the switching element in order to control the current flowing through the inductive component,
wherein a first magnetic flux generated by the current flowing through the first loop circuit as the switching element is being turned on and a second magnetic flux generated by the current flowing through the second loop circuit as the switching element is being turned off head in the same direction,
wherein the first loop circuit and the second loop circuit are stacked with each other in a direction of normal lines of the first and second loop circuits,
wherein the normal lines penetrate the first and second loop circuits, and
wherein a first direction of the current flowing through the first current pathway is opposite to a second direction of the current flowing through the second current pathway.

10. The switching apparatus according to claim 9, wherein the first direction of the current flowing through the first current pathway is opposite to the second direction of the current flowing through the second current pathway so that a first noise generated at the first current pathway and a second noise generated at the second current pathways cancel with each other.

* * * * *